US012577682B2

(12) United States Patent
Ramm

(10) Patent No.: US 12,577,682 B2
(45) Date of Patent: Mar. 17, 2026

(54) Al—Si CORROSION PROTECTION COATINGS

(71) Applicant: Oerlikon Surface Solutions AG, Pfäffikon, Pfäffikon (CH)

(72) Inventor: Jürgen Ramm, Maienfeld (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 406 days.

(21) Appl. No.: 18/039,096

(22) PCT Filed: Nov. 18, 2021

(86) PCT No.: PCT/EP2021/000144
§ 371 (c)(1),
(2) Date: May 26, 2023

(87) PCT Pub. No.: WO2022/117220
PCT Pub. Date: Jun. 9, 2022

(65) Prior Publication Data
US 2024/0003015 A1      Jan. 4, 2024

(30) Foreign Application Priority Data

Dec. 2, 2020    (DE) ........................ 10 2020 007 352

(51) Int. Cl.
*C23C 28/04*          (2006.01)
*C23C 14/08*          (2006.01)
          (Continued)
(52) U.S. Cl.
CPC ............ *C23C 28/04* (2013.01); *C23C 14/081* (2013.01); *C23C 14/10* (2013.01); *C23C 14/325* (2013.01); *C23C 16/24* (2013.01); *C23C 16/50* (2013.01)

(58) Field of Classification Search
None
See application file for complete search history.

(56) References Cited

U.S. PATENT DOCUMENTS 6,444,335 B1 *   9/2002   Wang ...................... F01D 5/288
                                                    416/241 B
2016/0297717 A1 *  10/2016  Schneiderbanger .... F01D 5/282

FOREIGN PATENT DOCUMENTS

EP          1754802 A2     2/2007
JP          2007-51364 A    3/2007
                (Continued)

OTHER PUBLICATIONS

International Preliminary Report on Patentability for International Application No. PCT/EP2021/000144 mailed on May 30, 2023, with its English Translation, 15 pages.
(Continued)

*Primary Examiner* — Jeffrey D Washville
(74) *Attorney, Agent, or Firm* — Bret E. Field; Bozicevic, Field & Francis LLP

(57) ABSTRACT

The invention relates to a layer system coated on a substrate, the layer system comprising a functional layer and an intermediate layer, the intermediate layer being disposed between the substrate and the functional layer, the functional layer comprising both the elements aluminum and silicon but not necessarily in elemental form, and the functional layer comprising oxygen or nitrogen or both, characterized in that the intermediate layer comprises, measured in at %, percent more silicon and/or percent more aluminum than the functional layer.

7 Claims, 13 Drawing Sheets

(51) Int. Cl.
|  |  |  |
|---|---|---|
| *C23C 14/10* | (2006.01) |
| *C23C 14/32* | (2006.01) |
| *C23C 16/24* | (2006.01) |
| *C23C 16/50* | (2006.01) |

(56) References Cited

FOREIGN PATENT DOCUMENTS

| JP | 2017-218644 A | 12/2017 |
|---|---|---|
| WO | WO2006099758 A2 | 9/2006 |

OTHER PUBLICATIONS

Written Opinion for International Application No. PCT/EP2021/000144 mailed on Feb. 23, 2022, with its English Translation, 13 pages.
Notice of Reasons for Refusal for Japanese Application No. 2023-532645 mailed Aug. 28, 2025, with its English translation, 10 pages.

\* cited by examiner

Al—Si CORROSION PROTECTION COATINGS

The present invention relates to components that are exposed to high temperatures, such as gas turbine blades, but also to other components of power conversion systems that are exposed to high surface temperatures and that need to be protected against wear due to oxidation and other chemical wear.

These components can be made from a variety of materials, such as high-alloy and low-alloy steel, Ni—Cr alloys such as Inconel and Hastelloy, Ni- and Co-based superalloys, Ti- and TiAl-based materials, and ceramic matrix composite material based on SiC and carbon, as well as oxide fiber-reinforced oxide composite materials (Ox/Ox materials).

All these components are subject to corrosion processes that lead to wear of these components. The corrosion processes generally lead to the loss of material or weakening of the mechanical properties of the components. For example, erosion processes caused by particles present in the atmosphere can lead to erosion of the components. Gases, such as chlorine or sulfur compounds, can also attack the surface of components. At high temperatures, oxidation can also occur, which in many cases leads to material loss. This is particularly true of reactions at very high temperatures, where water vapour is activated in such a way that silicon volatilization occurs in components containing silicon. To protect these components from corrosion, it is known to apply coatings. Among other things, coatings deposited from the gas phase are used here.

According to the conventional state of the art, TiN/Ti, TiN/TiAlN and TiAlN layer systems are used. These show improved erosion resistance but, for example in applications on high chromium steel substrates, insufficient corrosion resistance. For applications at higher temperature ranges, where the components comprise more temperature-stable materials, for example Inconel or Ti—Al materials, these layer systems lead to the formation of thin oxides on their surface, which are not mechanically stable and in turn lead to wear. A similar problem exists for materials comprising SiC-based CMC (Ceramic Matrix Composites), which form silicon volatile compounds at high temperatures in an oxygen atmosphere and water vapour and consequently also wear out.

The DE102015212588 represents a further development with regard to corrosion resistance through the application of layers. This describes a layer system for a corrosively stressed steel substrate with a surface, at least comprising a first, second and third layer, in which the first layer disposed between the surface of the substrate and the second layer is constructed as an adhesion promoter layer, the second layer is a ductile metallic layer having a columnar structure, and the third layer disposed on the side of the second layer facing away from the substrate is a ceramic oxide layer with a hardness of at least 20 GPa.

The hardness specification in the unit GPa refers to the pressure that the coating can resist the penetration of an object.

The construction of the first layer according to the state of the art as an adhesion promoter layer ensures a higher adhesion between the base material and the second layer of the layer system.

The second layer cathodically protects the substrate by acting as a sacrificial anode. The ductility of the second layer serves to absorb strains caused by oscillating loads without causing cracks in the layer. The columnar structure of the second layer serves to compensate for residual stresses caused by the third layer.

The third layer of the layer system preferably has aluminum oxide and/or chromium oxide and/or an aluminum-chromium oxide in mixed crystal structure. It can also consist entirely of these oxides. The oxides make the third layer resistant to oxidation, since it already comprises at least one oxide and can thus be used at high temperatures. The third layer has a very dense structure. Among other things, the third layer acts as corrosion protection for the second layer. Furthermore, the third layer has an insulating effect due to its ceramic nature, which advantageously prevents galvanic effects. Furthermore, the third layer is substantially harder than the base material and therefore acts advantageously for the underlying layers and the base material as protection against erosion, especially against droplet impact and particle erosion. Preferably, the hardness of the third layer is about 25 GPa.

Also known is a method for producing a layer system for a substrate exposed to corrosion, comprising three layers corresponding to the layer system according to the invention, the material of all layers being applied by physical vapour deposition (PVD). The method is advantageous because heat treatment is not required. Furthermore, layers applied by PVD have an advantageous surface roughness, which results in good aerodynamic properties.

According to the state of the art, the PVD layers of the layer system are applied by cathodic spark evaporation and/or by sputtering.

This three-layer layer system according to the state of the art is suitable for many applications. However, it shows adhesion problems if the substrate is an Si—C based material or contains substantial amounts of titanium, as is the case for titanium aluminides. In addition, it is advantageous if for specific application a layer system is desired which is intended as a support for a silicate, for example, but not limiting, an aluminum silicate or hafnium silicate.

It is therefore the object of the present invention to provide a layer system and its production with improved adhesion compared to that known from the prior art and/or which is adapted as a support for a silicate.

The inventors have found that, in order to solve the problem, it is useful in these cases to start from an Si-containing support, i.e. a layer system comprising, for example, Si, Si—O, Si—O—N, or comprising a mixture of these components with other oxides, for example Al—O. Even for components comprising oxides or containing oxides, as is the case with oxide fiber-reinforced oxide composite materials (Ox/Ox materials), better coating adhesion is achieved if the coating comprises layer systems comprising silicon, aluminum, oxygen and nitrogen.

According to one embodiment of the present invention, a layer system is produced on a component, which contains silicon as an essential (greater than 10 atomic percent (at. %)) element.

According to another improved embodiment of the present invention, the layer system contains Al as a second essential (greater than 10 atomic percent (at. %)) element.

Another object of the present invention is that this layer system protects the component from corrosion because the coating prevents the corrosion processes on the substrate materials of the components.

Another object of the present invention is to prevent or at the very least slow down reactions with oxygen and water vapour of the surface of the component of gas turbines at high temperatures.

Another object of the present invention is to improve the mechanical strength of component surfaces at elevated temperatures, particularly with respect to erosion by particles and volatilization in water vapour.

It is a further object of the present invention to disclose a method for performing a high rate silicon containing coating simultaneously or sequentially with a cathodic spark evaporation coating.

The invention will now be explained in detail with reference to various embodiments and with the aid of the figures by way of example:

Figure 2:
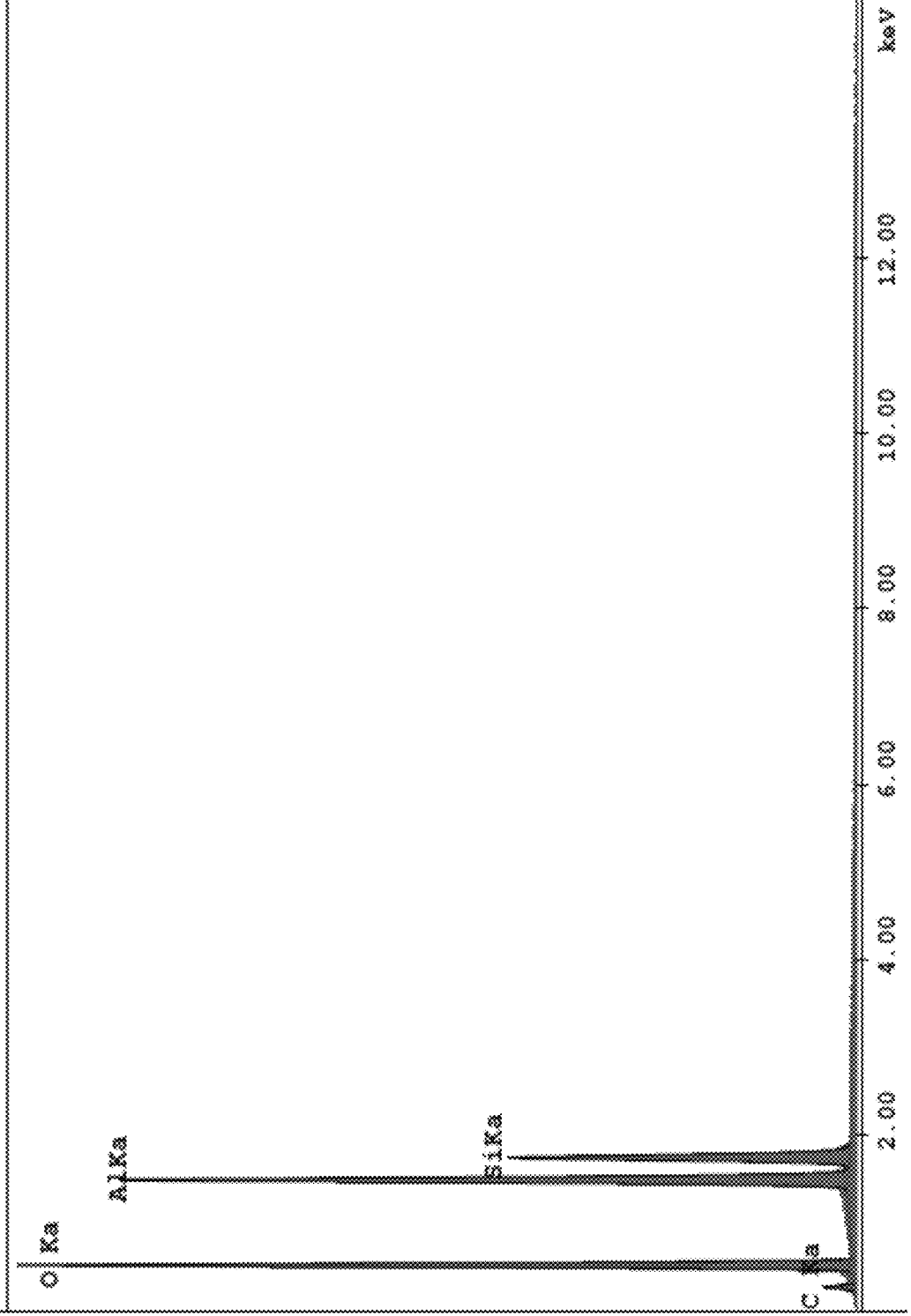
FIG. 2 shows the spectrum obtained by energy dispersive X-ray spectroscopy (EDX analysis) on a first Al—Si—O functional layer according to the invention, indicating a chemical composition of $Al_{0.24}Si_{0.15}O_{0.61}$.
Figure 3:
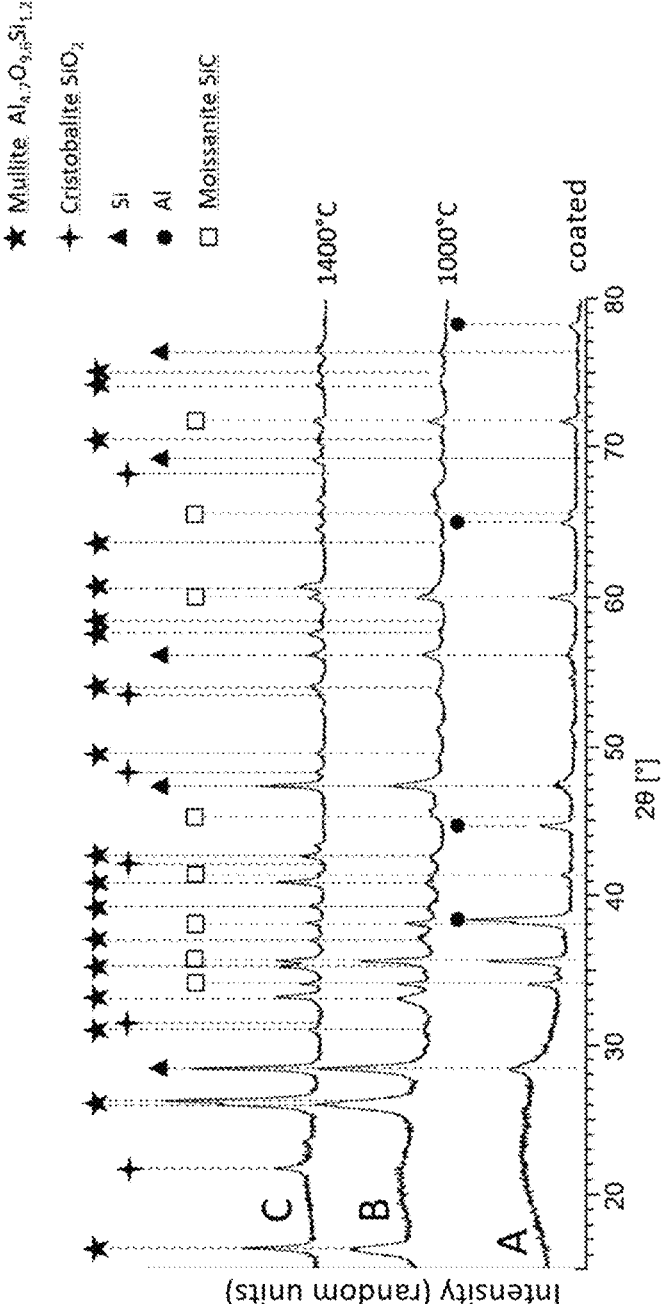

FIG. 3 shows three curves 3A to 3C with the X-ray spectrum of a SiC substrate coated with the same Al—Si—O layer system analyzed with EDX in FIG. 2. The X-ray spectrum was measured under grazing incidence of 2° to reduce the intensity of the moissanite peaks of the SiC substrate used. Nevertheless, the substrate peaks could not be completely suppressed: 3A spectrum after coating, 3B spectrum after aging at 1000° C., 3C spectrum after aging at 1400° C.

Figure 4:
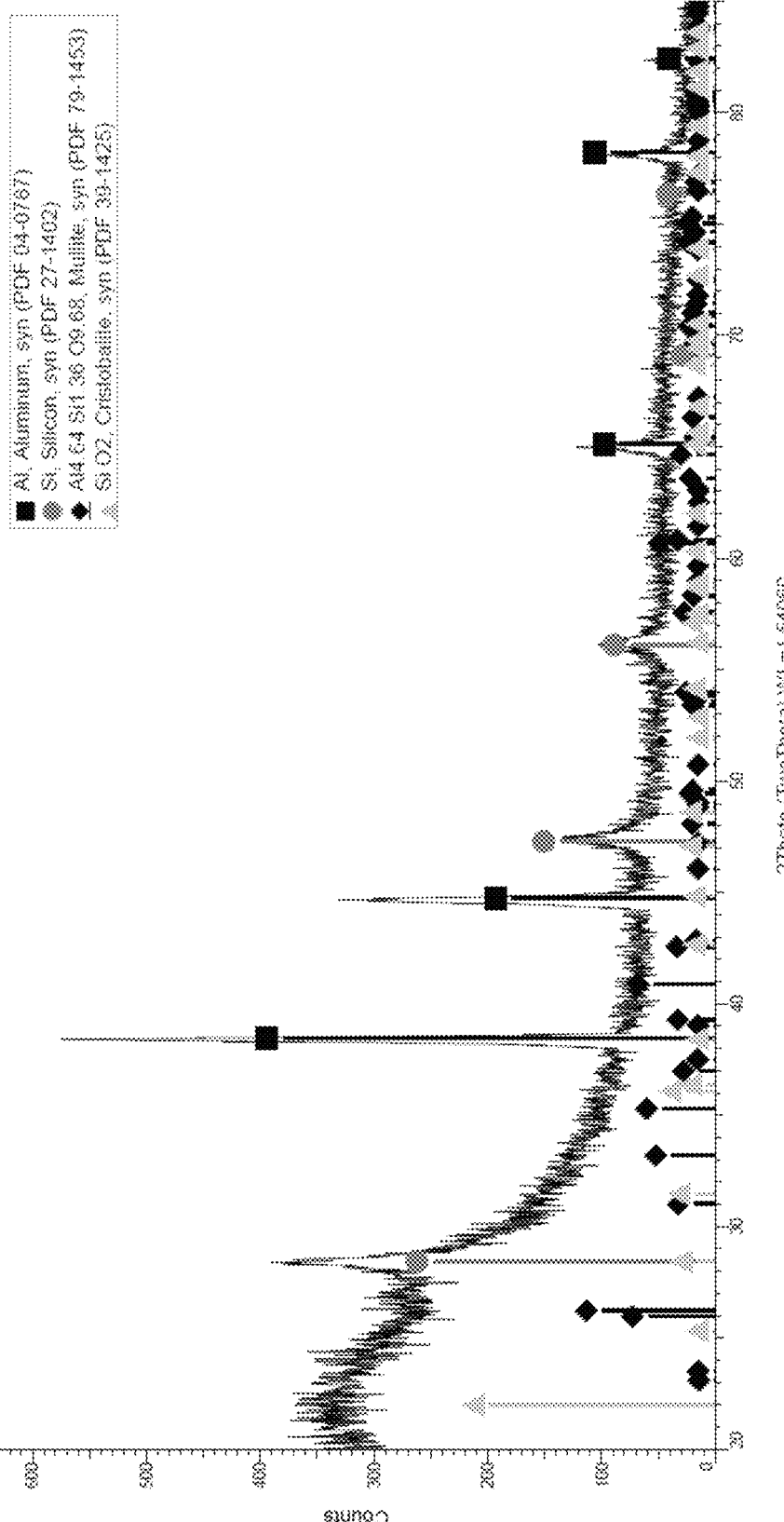

FIG. 4 shows the X-ray spectrum of a steel substrate coated with the same Al—Si—O layer system analyzed with EDX in FIG. 2. The X-ray spectrum was measured after coating under grazing incidence of 2° to avoid the moissanite peaks and to clarify other peaks and the location of the amorphous background.

Figure 5:
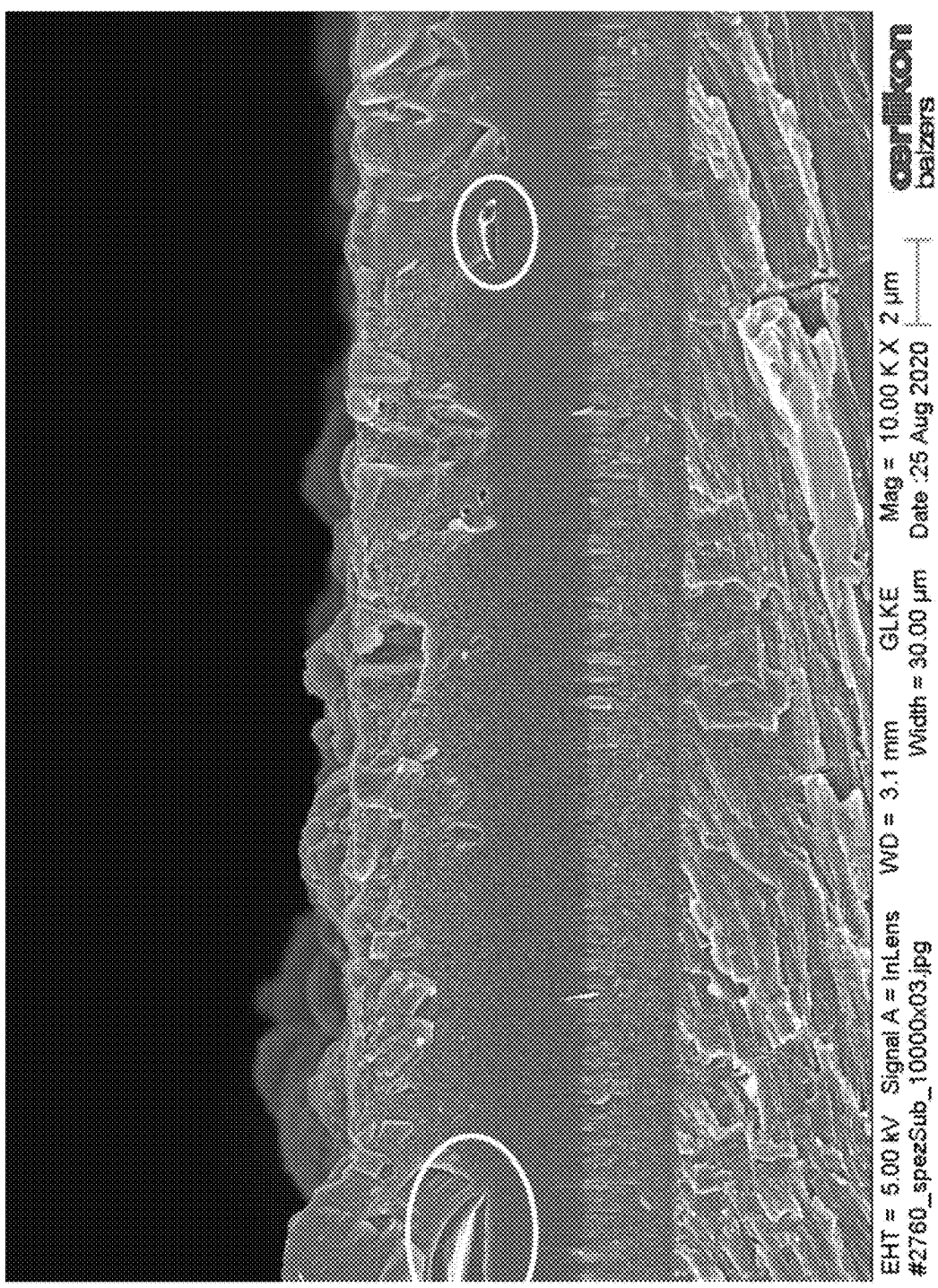

FIG. 5 shows a photograph of the fracture cross section on a sample of the same Al—Si—O layer system analyzed by EDX in FIG. 2. The coating was deposited on a Ti—Al substrate. As intermediate layer (ZW) a Si (ca. 2 μm)-SiO₂ (ca. 2 μm) layer was chosen and the functional layer is said Al—Si—O (ca. 3 μm) layer. The circles in the image of the fracture cross-section mark the areas with droplets of elemental aluminum as found in the XRD analysis.

Figure 6:
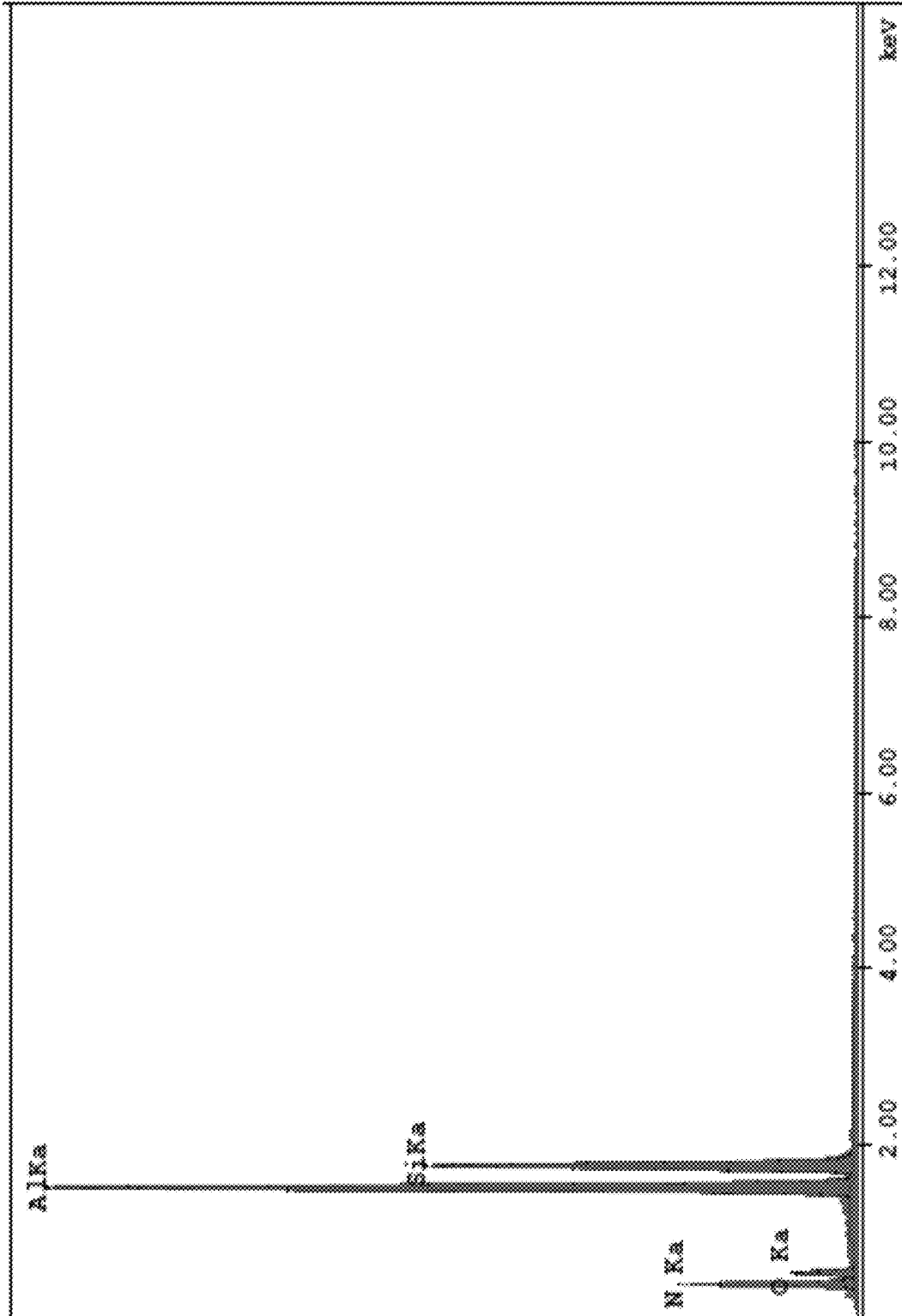

FIG. 6 shows the spectrum obtained by energy dispersive X-ray spectroscopy (EDX analysis) on a second Al—Si—O—N functional layer according to the invention, indicating a chemical composition of $Al_{0.27}Si_{0.20}O_{0.11}N_{0.42}$.

Figure 7:
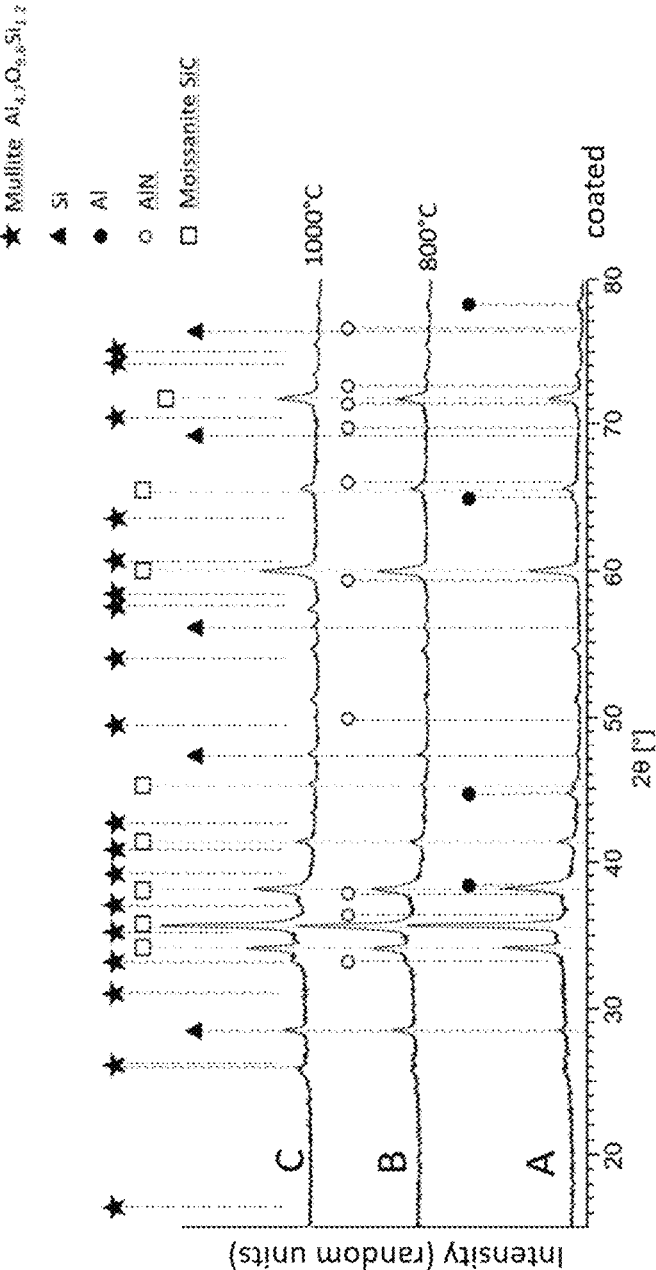

FIG. 7 shows with spectra 7A to 7C the X-ray spectrum of a SiC substrate coated with the same Al—Si—O—N layer system analyzed with EDX in FIG. 6. The X-ray spectrum was measured under grazing incidence of 2° to reduce the intensity of the moissanite peaks of the substrate used. Nevertheless, the substrate peaks could not be completely suppressed: 3A spectrum after coating, 3B spectrum after aging at 800° C., 3C spectrum after aging at 1000° C.

Figure 8:
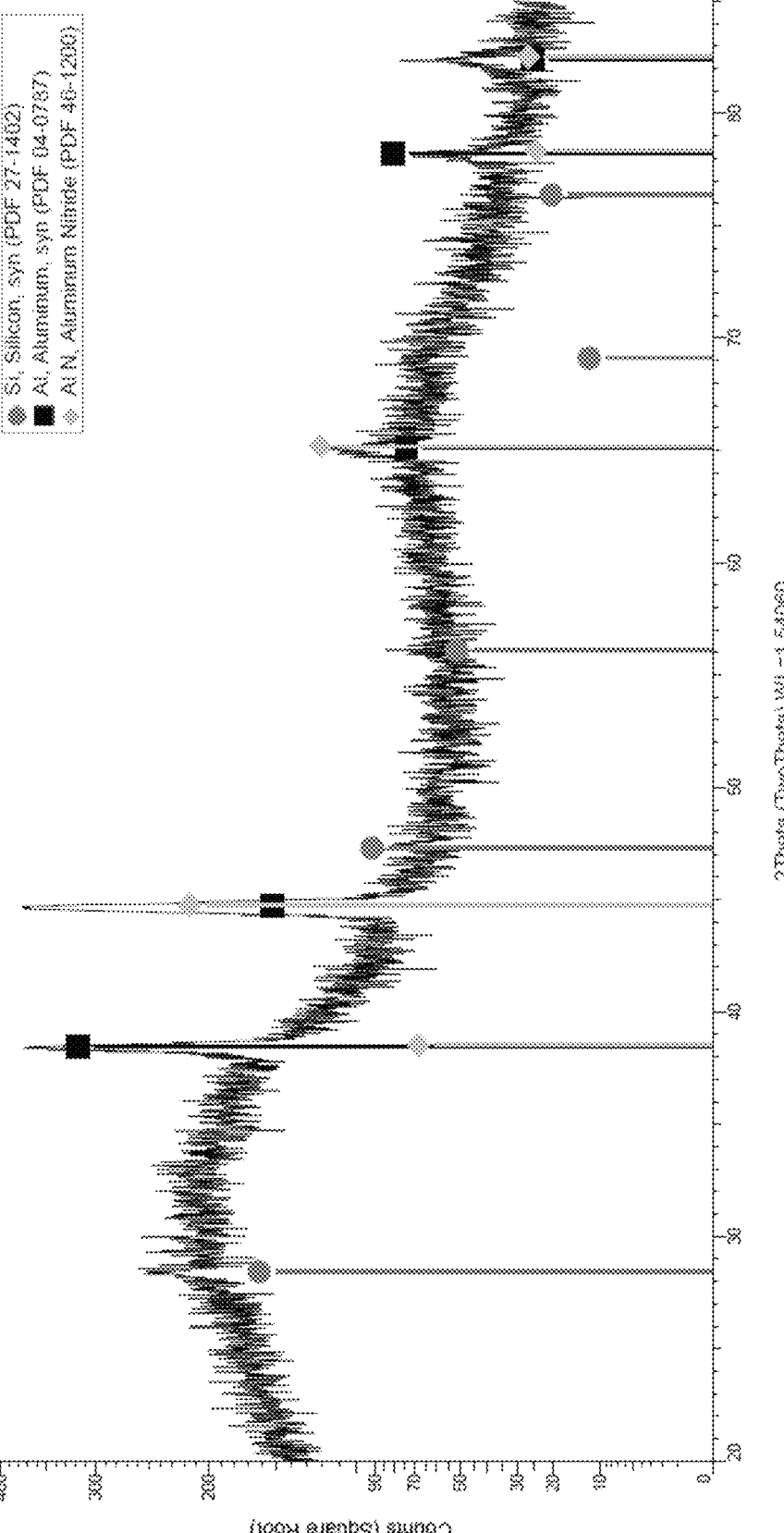

FIG. 8 shows the X-ray spectrum of a steel substrate coated with the same Al—Si—O—N layer system analyzed by EDX in FIG. 6. The X-ray spectrum was measured after coating under grazing incidence of 2° to avoid the moissanite peaks and to clarify other peaks and the location of the amorphous background.

Figure 9:
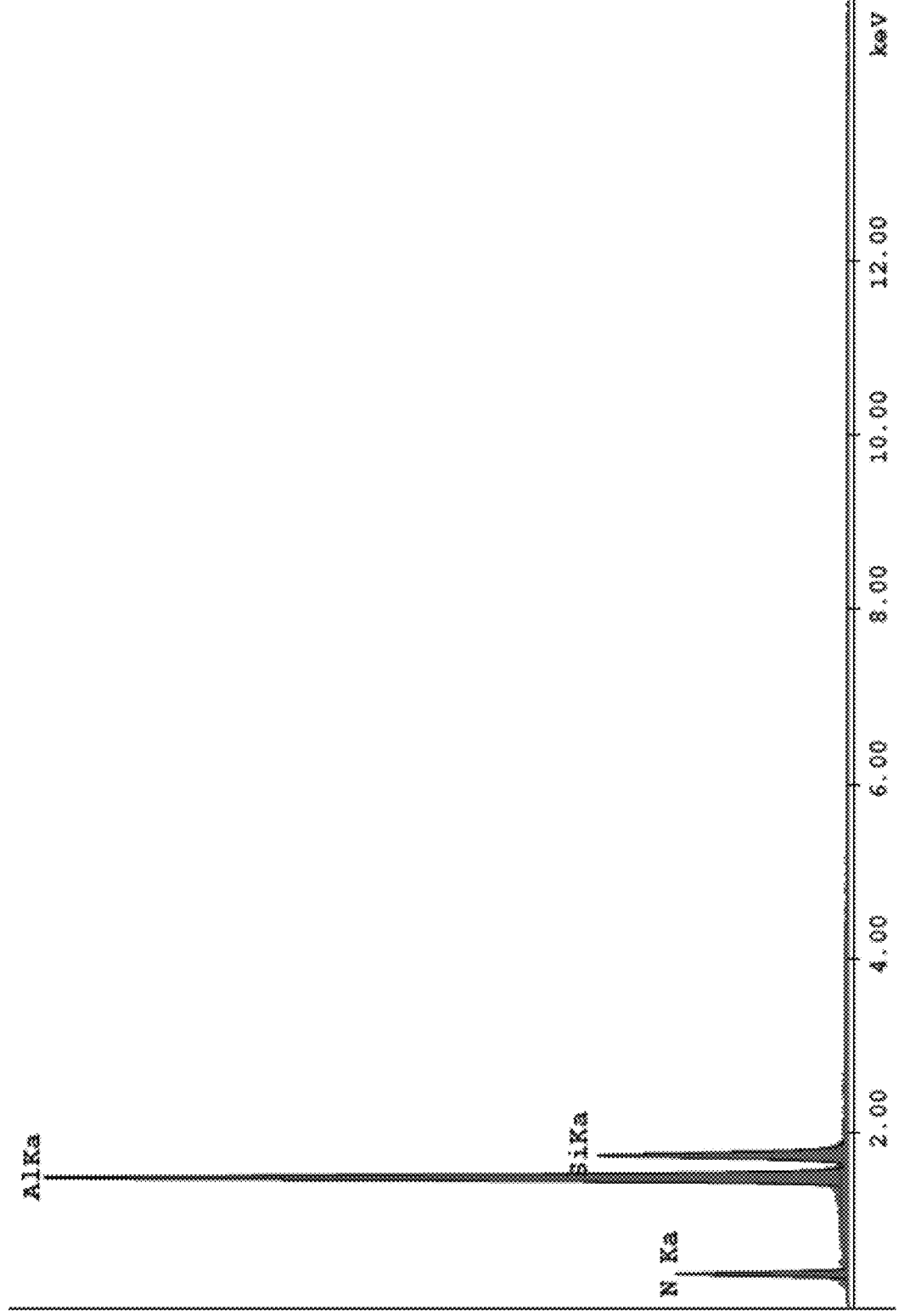

FIG. 9 shows the spectrum obtained by energy dispersive X-ray spectroscopy (EDX analysis) on a third Al—Si—N functional layer according to the invention, indicating a chemical composition of $Al_{0.33}Si_{0.16}N_{0.51}$.

Figure 10:
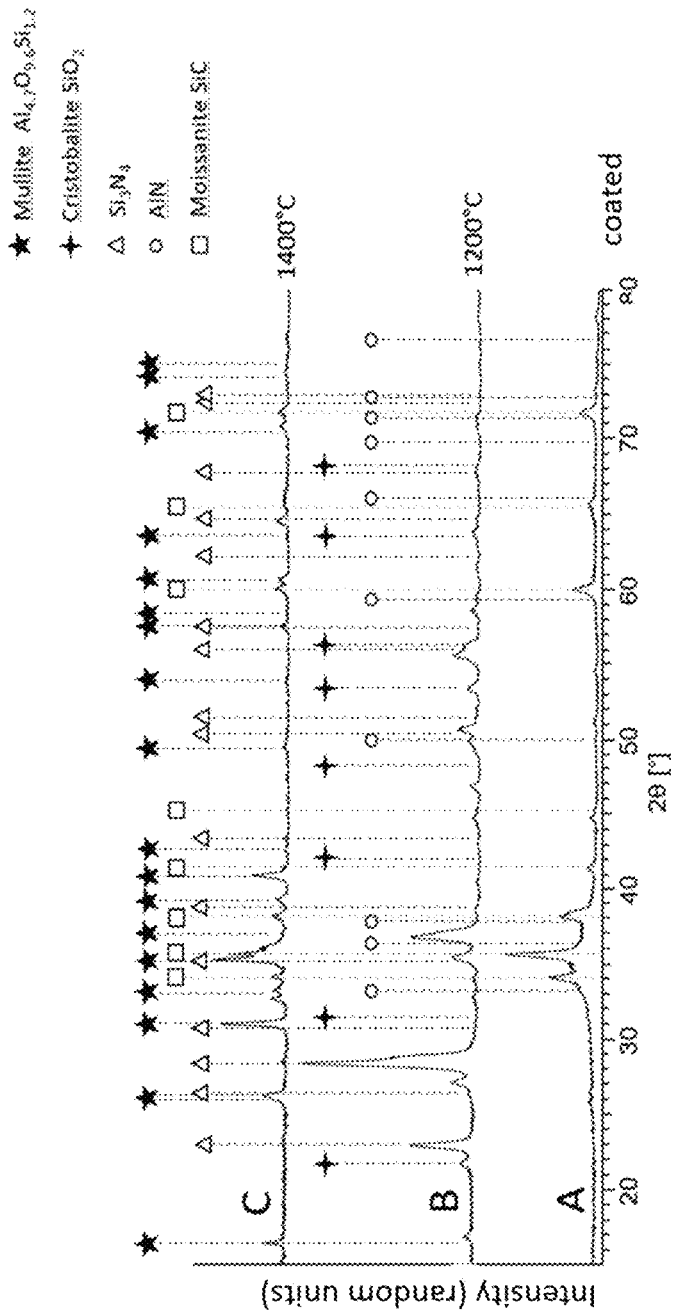

FIG. 10 shows the X-ray spectrum of a SiC substrate coated with the same Al—Si—N layer system analyzed with EDX in FIG. 9. The X-ray spectrum was measured under grazing incidence of 2° to reduce the intensity of the moissanite peaks of the substrate used. Nevertheless, the substrate peaks could not be completely suppressed: 3A spectrum after coating, 3B spectrum after aging at 1200° C., 3C spectrum after aging at 1400° C.

Figure 11:
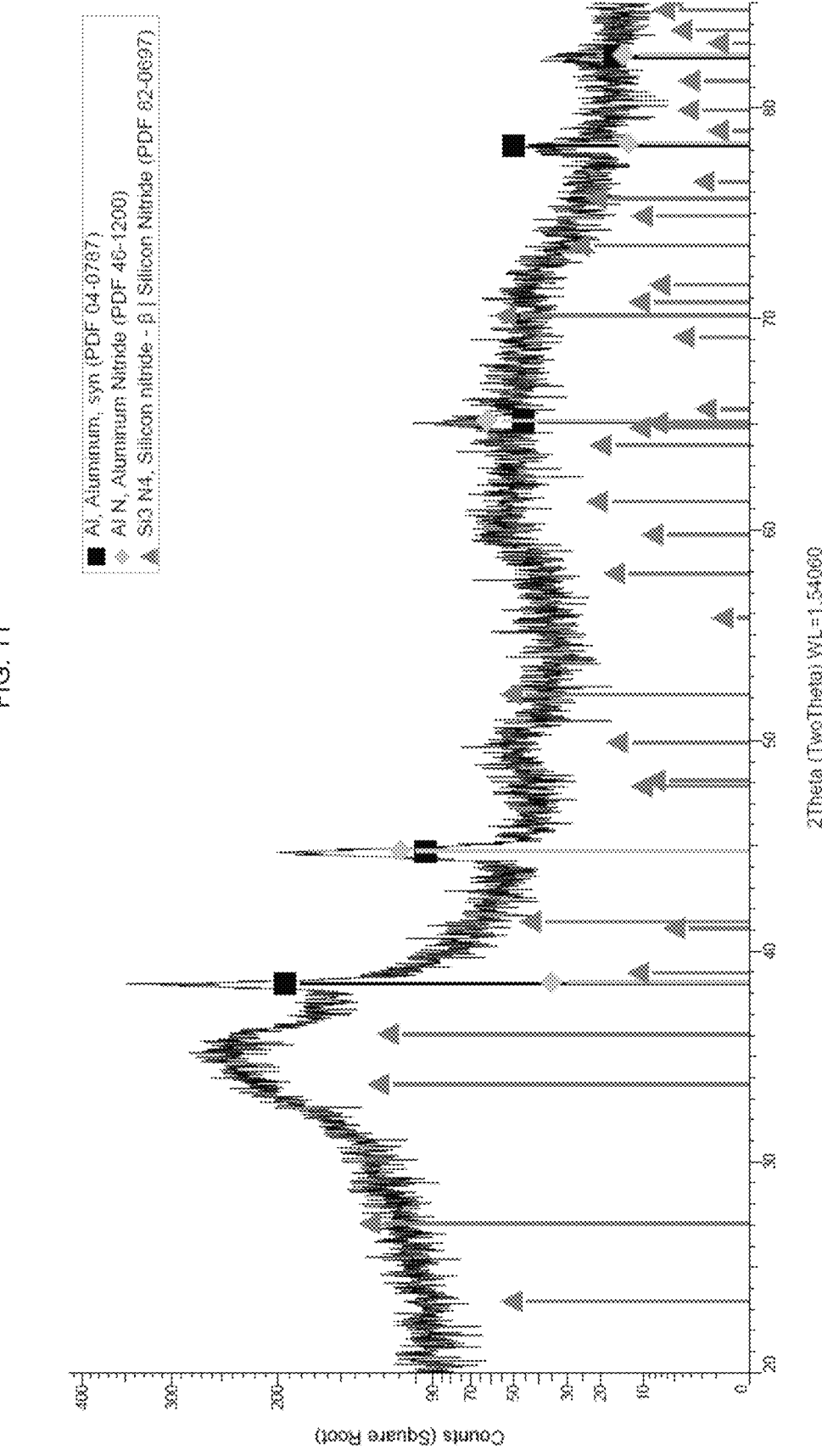

FIG. 11 shows the X-ray spectrum of a steel substrate coated with the same Al—Si—N layer system analyzed with EDX in FIG. 9. The X-ray spectrum was measured after coating under grazing incidence of 2° to avoid the moissanite peaks and to clarify other peaks and the location of the amorphous background.

Figure 12A:
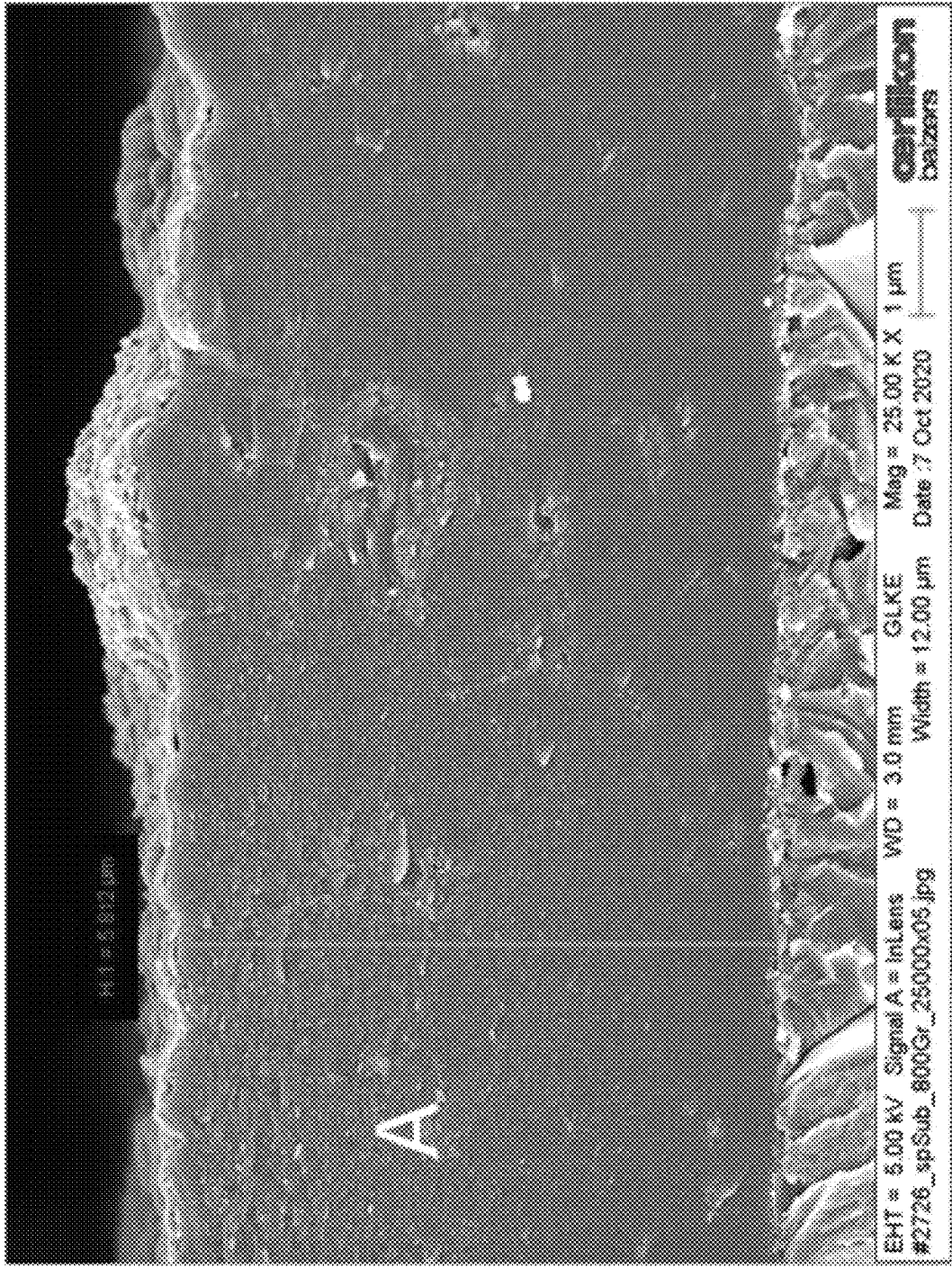
Figure 12B:
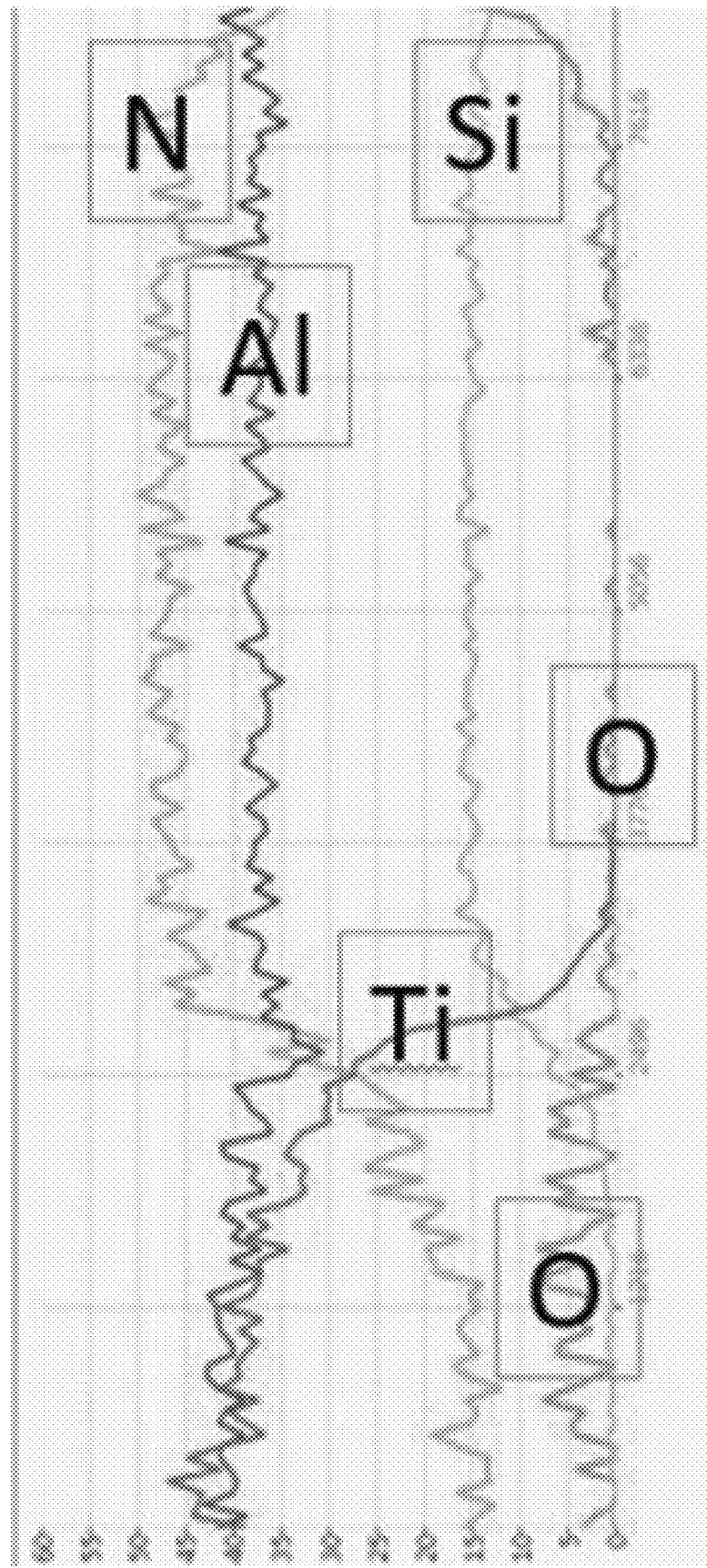

FIG. 12 (A) shows an example of the fracture cross-section of a coated Ti—Al substrate without an intermediate layer and the Al—Si—N functional layer of the invention with a thickness of about 5.8 μm. The coated sample was aged at 800° C. in ambient atmosphere for 20 h. In (B) the chemical composition along the fracture cross section is given, the so-called EDX line scan. From this profile it can be concluded that there is no oxygen in the layer, since only the signals of Al, Si and N can be seen. The weak intensity of the oxygen signal in the area of the substrate is caused by the sample preparation, since both components of the substrate material, Al as well as Ti, easily oxidize on their surface during preparation.

In the following, exemplary processes for the production of such layer systems according to the invention will be given, whereby the process parameters serve as an example, but can be varied in wide ranges, as known to the skilled person in this field. The coating process is a combination of physical vapour deposition (PVD) and plasma-enhanced chemical vapour deposition (PECVD), i.e. both methods are used, in particular simultaneously if necessary, to realize the coating synthesis. For example, electron beam evaporation, sputtering and/or cathodic spark evaporation can be used as PVD methods. The CVD methods are essentially based on additional gas inlets with which the various gaseous precursors can be admitted into the coating system used, which are then decomposed and excited in the plasma. Advantageously, the same coating system is used for the PVD methods and for the CVD methods. The plasma required for the CVD methods can be generated by means of the plasma source present due to the PVD method, i.e., for example, by the cathodic spark source. However, it can also be generated by other means, for example by a separate low voltage arc discharge. These methods are known to the skilled person in this technological field.

Figure 1:
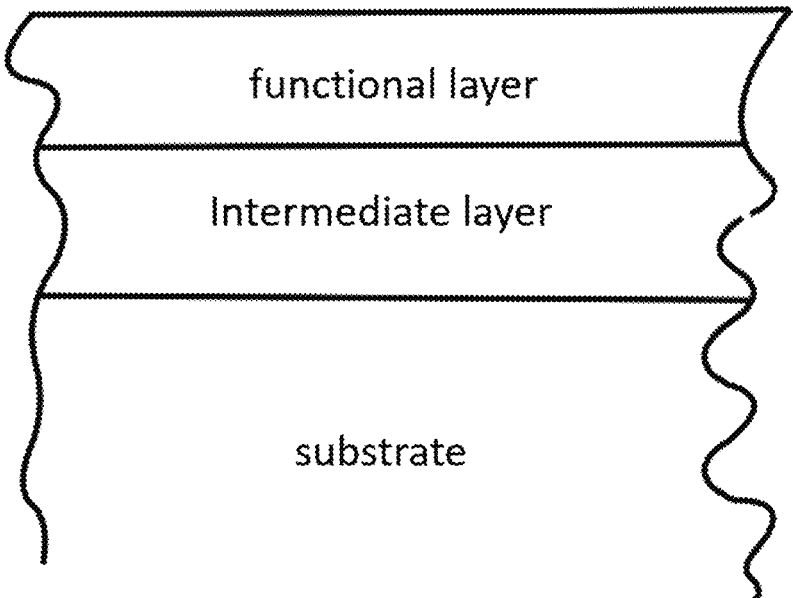
FIG. 1 shows the substrate or component, coated with an intermediate layer and functional layer according to the invention.

First, the process of producing the layer system according to the invention as shown in FIG. 1 is described, i.e. the deposition of an Al—Si containing layer on a substrate comprising an intermediate layer and a functional layer.

The substrates (components) are placed in the coating system and fixed on the corresponding holders. The holders are mounted on a substrate holder system which is stationary during coating and/or can be rotated once, twice and/or three times. The coating system is pumped down to a pressure of about $10^{-5}$ mbar or lower. Then the substrates are pre-treated. This involves heating them to a desired temperature of typically 100° C. to 600° C., for example, using radiant heaters, and performing substrate pre-treatment in the system, for example, cleaning the substrate surface by sputtering with argon gas ions. For the cleaning step/stage, a negative voltage (substrate bias) is usually applied to the substrates. A DC voltage is used for this, but it is also possible to perform this step/stage with a bipolar pulsed voltage or with an RF voltage.

After these pre-treatment steps/stages, in the example described here, a bipolar pulsed bias is applied to the substrates, for example with a pulse characteristic of nega- tive to positive bias (substrate versus ground) of, say, 90 $\mu s/10\ \mu s$ or 36 $\mu s/4\ \mu s$ or 20 $\mu s/20\ \mu s$ or 10 $\mu s/10\ \mu s$ or some other value useful for the layers to be fabricated. The reason for choosing the bipolar bias is the possible small, but quite desirable, electrical conductivity of the layers to be fabri- cated, which may even be completely insulating. In such layers, the bipolar operation guarantees the effectiveness of the bias on the layer-forming ions. In the example described here, the bipolar substrate bias at the bias supply is set to −40V/+40V for a pulse characteristic of 36 $\mu s/4\ \mu s$ and this bias is maintained throughout the coating.

As an example of an aluminum-silicon containing layer system, the synthesis of a Si/Al—Si—O layer in the method according to the invention from a combination of PVD and CVD process is now described. The Si layer forms the intermediate layer, while the Al—Si—O layer forms the functional layer. The coating starts with the ignition of an auxiliary plasma, for example a low-voltage arc discharge in argon (approx. 150 A discharge current at approx. $5\times10^{-3}$ mbar). Then the inlet of silane with a flux of 90 sccm occurs, which is effectively decomposed in such a type of plasma, and the deposition of silicon on the substrate surface, which forms the intermediate layer, occurs. In this example, the thickness of the silicon interface is limited to only about 0.5 $\mu m$ to 1 $\mu m$. However, this can also be chosen to be thinner, for example less than 0.1 $\mu m$, but also much thicker, for example 30 $\mu m$. Then the evaporation of the aluminum is started by igniting the cathodic spark discharge on the aluminum target. This sequence can also be carried out in reverse, if necessary: first the ignition of the cathodic spark discharge and then the inlet of the silane into the coating chamber, whereby no auxiliary plasma is required in this sequence, since the cathodic spark discharge already gener- ates a dense plasma. Oxygen is then admitted as a reactive gas at the same time or after a short delay. A noble gas or a mixture of noble gases can also be admitted as an auxiliary gas. In this example, the spark discharge is operated with a source current of 140 A, but discharge currents in the range between 50 A and 400 A can also be used. The oxygen flow in the example chosen here is 250 sccm. In this way, the substrates are coated with an Al—Si—O layer, whereby the chemical composition of this layer can be controlled in wide ranges via the evaporation rate of the Al target (i.e. via the size of the spark current), the silane flow and the oxygen flow, and consequently the chemical composition of the layer can be adjusted and can also be adjusted within the layer itself in a depth-dependent manner.

As a first example, a Si/Al—Si—O layer system was prepared according to the procedure described above and this layer system was analyzed using different methods. The results of this analysis are given and explained below. FIG. 2 shows the EDX spectrum of this layer system. From the spectrum, it can be seen that the layer is composed of the elements aluminum/silicon/oxygen (Al/Si/O) in a ratio of 24/15/61 atomic percent (at. %), so it can be described by a formula such as $Al_{0.24}Si_{0.15}O_{0.61}$. This composition corre- sponds approximately to that of a mullite compound. FIG. 3A gives the XRD spectrum of this layer on a SiC substrate after coating, which was measured at an angle of incidence of the X-ray beam of 2°, i.e. at grazing angle of incidence. The enlarged intensity of the signal in the 2theta region between 20° and 35° indicates an amorphous or fine crystalline oxide compound. The broadened peak is well approximated by mullite and alumina and silica standard peaks, oxide materials that are typical of the elemental composition found by EDX analysis. The XRD spectrum does not change shape significantly until about 800° C. With heating up to about 1000° C. (FIG. 3B), the peaks for mullite become more distinct, indicating a recrystallization process, but not manifesting itself in layer destruction, i.e., the experiment shows that the oxide phases were already present in fine crystalline phase after deposition and that no new phase formation occurs as a result of the aging. In the XRD analysis, the standard peak of $Al_{0.48}Si_{1.2}O_{9.6}$ was used for the mullite, as given in databases. If the layer is further aged at 1400° C. (FIG. 3C), an additional peak for cristobalite, a silicon oxide, may form.

FIG. 4 shows another XRD spectrum for the Si/Al— Si—O layer system, where this layer was deposited in the same process as that of FIG. 3, but on a steel substrate rather than on the SiC substrate. The reason for this was that with the SiC substrate, the substrate-specific moissanite peak overlaps with the aluminum peak, which proves an essential property of the Al—Si—O layer, namely the existence of Al regions within the layer. These regions, when the layer is exposed to atmosphere, promote the formation of the mullite structure by enabling diffusion processes. The figure shows another layer property more clearly than is evident from the XRD spectrum of FIG. 3, namely that the location of the intensity maximum of the amorphous peak is between 2theta 20° and 24°.

FIG. 5 also shows an SEM image of a cross-section of the layer, in which the areas of the aluminum regions in the layer that essentially occur as droplets have been marked in white circles.

It has already been pointed out at the beginning that the layer composition can be controlled by the evaporation rate of the aluminum and by the silane and oxygen fluxes. In a series of experiments, these influencing parameters were investigated and it was possible to prepare coatings with an Al to Si ratio in atomic percent (at. %) Al/Si between 2 and 5, comprising mullite and/or alumina and/or silica. The good agreement of the standard peak of $Al_{4.8}Si_{1.2}O_{9.6}$ from the database with the peak positions of the synthesized Al— Si—O, as well as the fact that the Al/Si ratio also agrees with the range for the determined layer compositions, are impor- tant properties of the Al—Si—O layers that guarantee their temperature stability and oxidation resistance.

Hardness measurements were also carried out on these coatings. Indentation hardnesses in the range between 9 GPa and 15 GPa were measured. These are significantly lower than the to 30 GPa measured on the Al—Cr—O coatings mentioned at the beginning of the state of the art, which are produced by cathodic spark evaporation.

For applications for which not only temperature stability and oxidation resistance of the coatings are important, but for which the coating hardness is also important, as is required for erosion protection coatings, for example, it is advantageous to increase the coating hardness of Al—Si—O coatings.

A further object of the invention is therefore to extend the good corrosion and oxidation resistance of the Al—Si—O coatings to higher hardness. This was achieved by adding nitrogen as another process gas to the silane and oxygen flow. FIG. 6 shows the EDX spectrum of an Al—Si—O—N film prepared with 90 sccm silane flow, 50 sccm oxygen flow, and a nitrogen flow of 470 sccm. The EDX analysis for this layer (FIG. 6) gives the values 27/20/11/42 for the ratio of Al/Si/O/N measured in atomic percent (at. %), i.e., a layer that can be described by the formula $Al_{0.27}Si_{0.20}O_{0.11}N_{0.42}$.

Measurement of the indentation hardness of the layer gave a value of 22 GPa for the process parameters given above, which is a much higher value than for the Al—Si—O layer prepared without nitrogen addition. The XRD spectrum of this layer immediately after the process is shown in FIG. 7A. Except for the substrate peaks (moissanite) and hints of the Si and Al peaks, only an enlarged intensity of a broad amorphous background can be noticed. In order to avoid the substrate influence on the spectrum (i.e. the moissanite peaks), the Al—Si—O layer prepared in the same process on a steel substrate was measured (as was done above for the Al—Si—O layer) and this XRD spectrum is given in FIG. 8. Comparing the XRD spectra of FIG. 4 and FIG. 8, the peaks of elemental Si and Al can be seen in both spectra. However, the position of the maximum of the amorphous peak has changed, shifting to larger 2theta angles. While the maximum of the amorphous peak in FIG. 4 is in the range of 2theta between 20° and 24°, for this composition of Al—Si—O—N it shifts to the range between 25° to 35°. The broad amorphous peak is again indicative of fine crystalline oxide or, which is also possible when nitrogen is used, fine crystalline nitride. No SiN peak can be identified in FIG. 8. However, the formation of cubic AlN cannot be excluded, since the peaks of Al and cubic AlN overlap and therefore cannot be separated without doubt. It is even likely that AlN forms in cubic structure based on the chemical composition determined by EDX. The broad amorphous peak indicates a fine crystalline layer of Al—Si—O—N. When heated in ambient atmosphere to 800° C. (FIG. 7B) and then to 1000° C. (FIG. 7C), peaks are again formed which can be attributed to mullite. In further experiments, a variety of gas flow combinations were investigated and indentation hardness was measured. According to the different gas compositions, hardnesses in the range between 16 and 26 GPa were obtained. Depending on how the ratio of the reactive gases silane, oxygen and nitrogen is selected, a certain composition of the Al—Si—O—N layer can be set.

Based on these results, coatings were also produced in which the addition of oxygen was completely omitted. FIG. 9 shows the EDX spectrum for such a layer. The EDX analysis for this layer gives the values 33/16/51 for the ratio of Al/Si/N, measured in atomic percent (at. %), i.e. a layer that can be described by the formula $Al_{0.33}Si_{0.16}N_{0.51}$. Also in this case, the layer stoichiometry can be set by adjusting the Al evaporation rate and by choosing the silane and nitrogen flux. It was found that these coatings, which were prepared without oxygen, have a hardness between 27 and 35 GPa, which is again an improvement with respect to this coating property. The XRD spectrum of the $Al_{0.33}Si_{0.16}N_{0.51}$ layer is shown in FIG. 10 on the SiC substrate and in FIG. 11 on the steel substrate. With reference to FIG. 10A, immediately after deposition, the film exhibits only the peaks that can be attributed to the SiC substrate, indicating an amorphous or fine crystalline layer of Al—Si—N. On the steel substrate (FIG. 11), the peaks of elemental Al and Si are again seen, and again no distinction can be made between the Al peak and the peak for cubic AlN. This spectrum is further characterized by a clear amorphous background, the maximum of which lies between 2theta 34° and 37°, indicating the SiN. When the layer is aged (FIG. 10B, 1200° C.), the peaks for AlN and Si become more clearly visible. At 1200° C. a clear peak for elemental Si appears and at the same time the peak for cristobalite, indicating diffusion processes. These seem to be completed at 1400° C. (FIG. 10C), as no cristobalite peak is visible anymore, but clearly the mullite has formed.

A further example will be used to demonstrate the property of the layer according to the invention as an oxidation barrier. Ti—Al substrate materials are particularly susceptible to oxidative wear. This is mainly due to diffusion processes, which cause Ti to oxidize at the surface and form a mechanically unstable, non-adherent oxide. Such processes affect the mechanical properties of the substrate even at temperatures as low as 700° C. Therefore, again as an example, a Ti—Al substrate was coated with an Al—Si—N layer, which based on EDX analysis can be described by a layer with the chemical composition $Al_{0.35}Si_{0.13}N_{0.52}$. FIG. 12 (A) shows the image of the fracture cross section on the coated Ti—Al substrate without an intermediate layer and the functional layer of Al—Si—N with a thickness of about 5.8 μm according to the invention. The coated sample was aged at 800° C. in ambient atmosphere for In (B) the chemical composition along the fracture cross section is given, the so-called EDX line scan. From this profile it can be concluded that there is no oxygen in the layer, since only the signals of Al, Si and N can be seen. The weak intensity of the oxygen signal in the area of the substrate has its cause in the sample preparation, since both components of the substrate material, Al as well as Ti, easily oxidize on their surface during preparation.

Summarizing the experimental results, it can be concluded that a combined method of PVD and CVD can be used to produce Al—Si—(O)—(N) coatings that are stable at high temperatures and inhibit oxygen diffusion. At the same time, the hardness of these coatings can be controlled by incorporating nitrogen and oxygen into the Al—Si—(O)—(N). Layers comprising oxygen, prepared with an Al to Si ratio in atomic percent (at. %) Al/Si between 2 and 5, either already exhibit portions of the high-temperature stable mullite during deposition, partly in amorphous or fine crystalline structure, or recrystallize when exposed to atmosphere and show distinct peaks of the mullite and/or corundum structure.

Al—Si—N coatings, i.e. coatings without oxygen content, are also characterized by temperature stability well above 1000° C. and by increased hardness.

In addition to coatings produced from an Al/Si ratio that is advantageous for the synthesis of the mullite structure, the combination of PVD and CVD methods also allows the synthesis of coatings with a higher silicon content, for example Al—Si—O coatings with an Al to Si ratio in atomic percent (at. %) Al/Si between 0.1 and 1.5. These coatings show an amorphous or fine crystalline structure immediately after deposition, which then changes into crystalline $SiO_2$ layers (e.g. crystoballite) when exposed to the atmosphere. This transition takes place at temperatures above 1000° C. and usually leads to layer destruction. Below this temperature, however, these layers are stable and are preferably suitable for corrosion protection coatings because of their amorphous structure.

According to the method described above, layer systems can also be advantageously produced in multi-layered structure, for example by varying the silane flow, the oxygen flow or the nitrogen flow each on its own or in combination with each other during a time frame, which then leads to a multi-layered structure in which the chemical composition is determined for each individual layer according to the set gas flow (and of course the Al evaporation rate).

Another important layer property compared to DE102015212588 is the absence of chromium in the layer according to the invention, which is desired for many applications and is even required by law for some areas.

The combination of PVD and CVD methods also leads to a significant increase in the deposition rate, which is mainly due to the fact that in addition to the Al content originating from the cathodic spark evaporation, a further Si content originating from the silane gas source is incorporated into the layer, i.e. it contributes directly to the layer thickness.

Thus, the present invention is particularly intended to extend the service life of components such as turbine blades in gas turbines by reducing the wear of the same and, at the same time, increasing the times between necessary service intervals.

The components whose surfaces are to be protected can be made from a variety of materials, such as high-alloy and low-alloy steel, Ni—Cr alloys such as Inconel and Hastelloy, Ni and Co-based superalloys, Ti and TiAl-based materials, and ceramic matrix composite material based on SiC and carbon, as well as oxide fiber-reinforced oxide composite materials (Ox/Ox materials).

The coating according to the invention is intended to increase the erosion resistance of the base material to solid particle impact, to droplet impact and also to blistering.

The coating according to the invention is intended to increase corrosion resistance to gases containing, for example, sulfur and chlorine, and to improve corrosion resistance to molten deposits such as CMAS ashes or melts of glass-like substances.

Furthermore, the coating according to the invention is intended to prevent or at least drastically reduce reaction with water vapour and associated volatilization of the base material.

A very important aspect of the coating according to the invention is the protection against oxidative wear of the components comprising the various materials, especially at high service temperatures, classified as "high" according to the substrate materials, i.e. for example 600° C. for stainless steel, 800° C. for Inconel or Hastelloy, 800° C. for Ti—Al compounds, 1000° C. for Ni or Co based superalloys, 1100° C. for superalloys with MCrAlY coating or 1000° C. for SiC based CMC materials.

According to the invention, the object is solved by a component according to claim 1. The component according to the invention has an erosion- and corrosion-resistant coating with a functional layer and an intermediate layer disposed between the component surface and the functional layer.

With respect to various advantageous embodiments, the following may be enumerated, among others:

The intermediate layer may be a layer system comprising silicon and aluminum, and may additionally comprise elements of the component material.

The functional layer essentially comprises the elements Al, Si, O and N.

The functional layer can be a mono-layered layer or a multi-layered layer.

If the functional layer is a multi-layered structure, it is advantageous if the Al/Si ratio and/or the O/N ratio change periodically over at least part of the layer thickness and/or aperiodically over at least part of the layer thickness.

Particularly preferably, the ratio of Al to Si (Al/Si) atoms in the functional layer is between 2 and 5.

The functional layer is characterized by Al droplets, which are in the as-deposited state in the layer and which contribute to diffusion processes and the formation of mullite structures during the aging process.

TABLE for FIG. 2:

| Element | Wt % | At % | K-Ratio | Z | A | F |
|---|---|---|---|---|---|---|
| O K | 47.64 | 60.91 | 0.2302 | 1.0336 | 0.4673 | 1.0005 |
| AlK | 31.70 | 24.04 | 0.2542 | 0.9566 | 0.8333 | 1.0056 |
| SiK | 20.66 | 15.05 | 0.1393 | 0.9800 | 0.6883 | 1.0000 |
| Total | 100.00 | 100.00 | | | | |

| Element | Net Inte. | Bkgd Inte. | Inte. Error | P/B |
|---|---|---|---|---|
| O K | 624.37 | 4.68 | 0.40 | 133.41 |
| AlK | 752.69 | 11.89 | 0.37 | 63.30 |
| SiK | 381.78 | 9.41 | 0.52 | 40.57 |

TABLE for FIG. 6:

| Element | Wt % | At % | K-Ratio | Z | A | F |
|---|---|---|---|---|---|---|
| N K | 28.34 | 41.71 | 0.0714 | 1.0470 | 0.2406 | 1.0004 |
| O K | 8.34 | 10.75 | 0.0194 | 1.0374 | 0.2235 | 1.0005 |
| AlK | 35.44 | 27.08 | 0.3094 | 0.9602 | 0.9019 | 1.0081 |
| SiK | 27.87 | 20.46 | 0.1919 | 0.9840 | 0.6995 | 1.0000 |
| Total | 100.00 | 100.00 | | | | |

| Element | Net Inte. | Bkgd Inte. | Inte. Error | P/B |
|---|---|---|---|---|
| N K | 150.62 | 1.79 | 0.82 | 84.15 |
| O K | 55.18 | 2.26 | 1.40 | 24.42 |
| AlK | 963.40 | 12.04 | 0.33 | 80.02 |
| SiK | 552.66 | 9.04 | 0.43 | 61.13 |

TABLE for FIG. 9:

| Element | Wt % | At % | K-Ratio | Z | A | F |
|---|---|---|---|---|---|---|
| N K | 34.43 | 50.61 | 0.0873 | 1.0498 | 0.2414 | 1.0002 |
| AlK | 43.82 | 33.44 | 0.3904 | 0.9629 | 0.9198 | 1.0059 |
| SiK | 21.75 | 15.95 | 0.1416 | 0.9867 | 0.6596 | 1.0000 |
| Total | 100.00 | 100.00 | | | | |

| Element | Net Inte. | Bkgd Inte. | Inte. Error | P/B |
|---|---|---|---|---|
| N K | 185.18 | 1.80 | 0.74 | 102.88 |
| AlK | 1223.14 | 12.50 | 0.29 | 97.85 |
| SiK | 410.35 | 8.63 | 0.50 | 47.55 |

The invention claimed is:

1. A layer system coated on a substrate, the layer system comprising a functional layer and an intermediate layer, the intermediate layer being disposed between the substrate and the functional layer, the functional layer comprising both the elements aluminum and silicon but not necessarily in elemental form, and the functional layer comprising oxygen or nitrogen or both, wherein the intermediate layer comprises, measured in atomic percent, at least more silicon or more aluminum than the functional layer, wherein the functional layer is a multi-layered layer and at least the Al/Si ratio or the O/N ratio change at least periodically over at least part of the layer thickness or aperiodically over at least part of the layer thickness.

2. The layer system according to claim 1, wherein the intermediate layer is a layer system which comprises silicon and aluminum and which may additionally also comprise at least one further element from the material of the substrate.

3. The layer system according to claim 1, wherein the functional layer comprises, in addition to at least the elements Al, Si, O or N, other elements, if any, only as at least doping or impurity.

4. The layer system according to claim 1, wherein the functional layer is a mono-layered layer or a multi-layered layer.

5. The layer system according to claim 1, wherein the ratio of Al to Si (Al/Si) atoms in the functional layer is between 2 and 5.

6. The layer system according to claim 1, wherein the functional layer comprises Al droplets which are present in the layer in the as-deposited state and which contribute to diffusion processes and to the formation of mullite structures during the aging process.

7. A layer system coated on a substrate, the layer system comprising a functional layer and an intermediate layer, the intermediate layer being disposed between the substrate and the functional layer, the functional layer comprising both the elements aluminum and silicon but not necessarily in elemental form, and the functional layer comprising oxygen or nitrogen or both, wherein the intermediate layer comprises, measured in atomic percent, at least more silicon or more aluminum than the functional layer, wherein the intermediate layer comprises, in addition to the elements Al and Si, elements, if any, only as at least doping or impurity or comprises one or more group elements of the group comprising of: metal of the substrate material, Si—O, Si—N, Si—O—N, Al—O, Al—N, Al—O—N.

* * * * *